United States Patent
Tao et al.

[11] Patent Number: 6,037,266
[45] Date of Patent: Mar. 14, 2000

[54] METHOD FOR PATTERNING A POLYSILICON GATE WITH A THIN GATE OXIDE IN A POLYSILICON ETCHER

[75] Inventors: Hun-Jan Tao; Chia-Shiung Tsai, both of Hsin-Chu, Taiwan

[73] Assignee: Taiwan Semiconductor Manufacturing Company, Hsin-Chu, Taiwan

[21] Appl. No.: 09/161,567

[22] Filed: Sep. 28, 1998

[51] Int. Cl.[7] .................................................. H01L 21/00
[52] U.S. Cl. ........................ 438/719; 438/738; 438/743; 438/744
[58] Field of Search ..................................... 438/712, 714, 438/719, 723, 724, 733, 738, 743, 744, 636; 216/67, 79

[56] References Cited

U.S. PATENT DOCUMENTS

| | | | |
|---|---|---|---|
| 5,094,712 | 3/1992 | Becker et al. | 156/643 |
| 5,219,788 | 6/1993 | Abernathey et al. | 437/187 |
| 5,346,586 | 9/1994 | Keller | 156/656 |
| 5,545,588 | 8/1996 | Yoo | 437/187 |
| 5,747,388 | 5/1998 | Kusters et al. | 438/724 X |
| 5,767,018 | 6/1998 | Bell | 438/744 X |
| 5,885,902 | 3/1999 | Blasingame et al. | 438/719 X |

*Primary Examiner*—William Powell
*Attorney, Agent, or Firm*—George O. Saile; Stephen B. Ackerman; William J. Stoffel

[57] ABSTRACT

A method of patterning a polysilicon gate using an oxide hard mask using a novel 4 step insitu etch process. All 4 etch steps are performed insitu in a polysilicon high density plasma (TCP—transformer coupled plasma) etcher. A multi-layered semiconductor structure 35 (FIG. 1) is formed comprising: a substrate 10, a gate oxide layer 14, a polysilicon layer 18, a hard mask layer 22, and a bottom anti-reflective coating (BARC) layer 26 and a resist layer 30. The 4 step insitu etch process comprises:

a) in STEP 1, etching the bottom anti-reflective coating (BARC) layer by flowing HBr and $O_2$ gasses, and applying a first TCP Power and a first Bias power;

b) in STEP 2, etching the hard mask by flowing a flouorocarbon gas; and applying a second TCP Power and second Bias power;

c) in STEP 3—stripping the bottom anti-reflective coating (BARC) layer by flowing oxygen and applying a third TCP Power and a third Bias power;

d) in STEP 4—etching the polysilicon layer by flowing chlorine species, oxygen species; Helium species and bromine gas species and applying a fourth TCP Power and a fourth Bias power.

16 Claims, 2 Drawing Sheets

METHOD FOR PATTERNING A POLYSILICON GATE WITH A THIN GATE OXIDE IN A POLYSILICON ETCHER

BACKGROUND OF INVENTION

1) Field of the Invention

This invention relates generally to fabrication of polysilicon gates in a semiconductor device and more particularly to the in-situ etching of a bottom anti-reflective coating (BARC) layer, an oxide layer and a polysilicon layer in one high density plasma (HDP) polysilicon etcher.

2) Description of the Prior Art

Semiconductor manufacturing technology has advanced to the point where a single die may contain millions of active devices. A key requirement for fabricating such high density circuits is the elimination of contaminants from the manufacturing process. This has led to the development of ultra high vacuum processing and closed manufacturing systems. Such closed systems Preferably include insitu Process sequences that can be precisely controlled without exposure of the wafer to the ambient.

One area of semiconductor manufacture in which the elimination of contaminants and the precise control of process sequences is important is in the etching techniques for etching different film layers formed on the wafer. In general, integrated circuits are formed by patterning regions on a substrate and the by patterning layers formed on the substrate. As an example, a substrate is typically formed with an oxide layer, such as silicon dioxide. This oxide layer may function as a gate oxide to the active devices formed on the substrate. In addition this oxide layer may function as the dielectric layer for capacitors formed on the substrate. Other film layers may be formed or deposited on the gate oxide. As an example, polysilicon may be deposited on the gate oxide layer as a surface conduction layer. Other films in turn, may be deposited on the polysilicon layer. These various film layers must be patterned and etched to the gate oxide. The technique of photolithography is frequently used to pattern and etch these different film layers. Typically this involves coating the wafer with a photoresist. The photoresist is then exposed with ultraviolet radiation through a mask. A desired pattern is thus imaged on the photoresist to form a photoresist mask. The photoresist mask includes exposed areas that allow an underlying film to be etched using wet or dry etching processes. The etch depth or endpoint must be closely controlled to insure that an underlying layer (i.e. gate oxide) is not also etched through. For etching the small dry features required for high density application, Dry etch processes are typically utilized. With dry etching, gasses are the primary etch medium. Plasma dry etching uses plasma energy to drive the reaction.

As the industry moves towards higher density applications, the gate oxides used for the active devices of a semiconductor have tended to become thinner. Such thin gate oxides require etching techniques and etchants that are highly selective to the gate oxide are is then a need in the industry for better methods for patterning and etching the layers of a semiconductor structure, particularly polysilicon which have been formed on a thin gate oxide.

It is known in the industry that in a plasma dry etch process the etch selectivity to a gate oxide can be more easily achieved when there is no photoresist present during the polysilicon to gate oxide etch step. Accordingly, in a representative prior art process sequence for etching a semiconductor structure that includes a gate oxide, another oxide layer is first deposited over the semiconductor structure. A layer of photoresist in then deposited on the oxide layer. An oxide hard mask is formed to the polysilicon layer by etching the oxide layer through the photoresist mask. For stripping the photoresist, the wafer is transferred to a photoresist strip chamber. With the photoresist removed, the wafer is transferred to a poly etch chamber to etch the polysilicon layer to the gate oxide.

The transfer of the wafer during the different etch steps tends to introduce contaminants during this process. In particular, exposure of the wafers to ambient may introduce contaminates. Additionally, each different process chamber may introduce contaminants. Moreover, process parameters are difficult to control with physical transfer of the wafers between these different process stations. Finally, the operation of these different process stations is time consuming and adds to production costs.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,545,558(Yoo) shows a method of etching a gate by etching 1) ARC hard mask, 2) SOG and 3) poly.

U.S. Pat. No. 5,219,788(Abernathey) Bilayer metallization cap for photolithography—shows a process of patterning a conductive layer.

U.S. Pat. No. 5,346,586(Keller) Method for selectively etching polysilicon to gate oxide using an insitu ozone photoresist strip—The method is performed insitu in a plasma etch chamber.

U.S. Pat. No. 5,094,712(Becker) One chamber in-situ etch process for oxide and conductive material—shows a method to anisotropically etch an oxide/silicide/poly sandwich structure on a silicon wafer substrate in-situ, that is, using a single parallel plate plasma reactor chamber and a single inert cathode.

However, further improvements are necessary.

SUMMARY OF THE INVENTION

It is an object of the present invention to provide a method for fabrication a submicron polysilicon gate.

It is an object of the present invention to provide a method for stripping a photoresist layer and etching through a polysilicon layer to a gate oxide.

It is a further object of the present invention to provide a method for etching through a polysilicon layer to a gate oxide that can be performed insitu so that contamination can be eliminated.

It is another object of the present invention to provide a method of plasma dry etching a polysilicon layer to a gate oxide which is relatively inexpensive and adaptable to large scale semiconductor manufacture.

It is an object of the present invention to provide a method forming a hardmask for 0.25 and 0.18 μm dimensions using a DUV Resist 30/organic BARC 26/oxide hard mask 22/poly or amorphous silicon 18/Gate oxide structure.

It is an object of the present invention to provide a method etching polysilicon in a single polysilicon etcher using a three step process comprising ① a BARC 26/oxide hard mask 22 etch ② an insitu PR/BARC strip and ③ a polysilicon 18 etch.

It is an object of the process to simply the process flow with good CD control and good Gate oxide integrity.

To accomplish the above objectives, the present invention provides a method of etching polysilicon using an oxide hard mask. The invention has a three step etch process that are performed insitu in a high density plasma etcher.

A multi-layered semiconductor structure 35 (FIG. 1) is formed comprising: a substrate 10, a gate oxide layer 14, a polysilicon layer 18, a hard mask layer 22, and a bottom anti-reflective coating (BARC) layer 26 and a resist layer 30.

Next, the invention's 4 step insitu etch process is performed. All 4 steps are performed insitu in a TCP poly etcher.

The invention's etch process can be describe as follows:

TABLE

Invention's Etch process insitu a TCP poly etcher

| STEP | pressure (mtorr) | TCP Power (W) | Bias power (W) | Gas flows (SCCM) | Gas Flows (SCCM) | Gas flows (SCCM) |
|---|---|---|---|---|---|---|
| (1) BARC Open | 5 to 30 (tgt = 10) | 100–300 (tgt = 250) | 100–300 (Tgt = 250) | HBr 50 to 60 (tgt = 50) | $O_2$ 5–30 (tgt = 15) or $N_2$ 10–40/$O_2$ 5–30 | |
| (2) Oxide Open | 5 to 30 (tgt = 10) | 100 to 400 (tgt = 300) | 100–300 (Tgt = 250) | $C_2F_6$ 50 to 120 (tgt = 100) or $CF_4$ 50–120 tgt = 100 | | |
| (3) BARC striping | 5 to 80 (tgt = 20) | 100 to 400 (tgt = 300) | 0 to 200 (tgt = 0) | $O_2$ 100 to 500 (tgt = 200) | | |
| (4) Polysilicon Main etch (ME) | 5 to 30 (tgt = 10) | 100–300 (tgt = 150) | 100–300 (Tgt = 150) | $Cl_2$ 30 to 100 (tgt 50) | $HeO_2$ 0 to 20 (tgt = 10) | HBr 100 to 400 (tgt = 200) |
| Polysilicon overetch (OE) | 50 to 30 (tgt = 10) | 100–300 (tgt = 150) | 100–300 (Tgt = 150) | $Cl_2$ 30 to 100 (tgt 50) | $HeO_2$ to 30 (tgt = 15) | HBr 50 to 300 (tgt = 150) |

A key step in the invention is step 1—the hard mask open etch (FIG. 2). The important parameters of step 2 are:

high density plasma (HDP) etch low pressure 1 to 50 mtorr—this improves critical dimension (CD)—Prior art RIE etches cannot separately control power and have inadequate critical dimension (CD).

HDP with separate bias and power controls—Prior art RIE etches cannot separately control power and have inadequate critical dimension (CD).

Mostly Carbon fluoride etch gasses ($C_xF_yH_z$(e.g., $C_2F_6$)) with trace $O_2$ (($CxF_yH_z$:$O_2$ ratio is>10:1), with Ar gas. Ar is critical to control critical dimension (CD) uniformity (50 to 500 sccm).

A. Benefits

The present invention provide a method of forming a hardmask for 0.25 and 0.18 μm dimensions. The invention uses a DUV Resist 30/organic BARC 26/oxide hard mask 22/poly or amorphous silicon 18/Gate oxide structure. See FIG. 1. The invention has a ① BARC 26/oxide hard mask 22 etch in a high density plasma etcher ② followed by an insitu PR/BARC strip. This is followed by a ③ polysilicon 18 etch using the oxide hard mask to from a polysilicon gate.

The invention improves the formation of submicron gates by providing:

Step 2—FIG. 2

Oxide hardmask etch (Step 2—FIG. 2) by high density plasma etch for better critical dimension (CD) control.—(Can not use RIE etch because can not separately control power thereby can not achieve adequate CD control).

Oxide hardmask open (Step 2—FIG. 2) by an etch with high oxide to silicon selectivity so as to avoid microtrench during mask open.

The etch (step 2—FIG. 2) for hardmask open can run at low pressure (<50 mtorr) to ensure the tight CD control.

Step 3—FIG. 3

The HPD polysilicon etcher (Step 2—FIG. 3) is capable to run insitu PR/BARC removal with biased $O_2$ plasma to avoid BARC residue.

Overall 4 step etch process all 4 steps—preformed in 1 HDP etcher—process for BARC/oxide etch, PR/BARC removal and Poly etch—this increases throughput Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a submicron polysilicon gate. Key features of the invention are the 4 step etch in one polysilicon TCP (HDP) etcher that has step 1—BARC/oxide etch, step 2—PR/BARC removal and step 3—Poly etch. Of particular importance are the first two steps that provide improved critical dimension (CD) uniformity and increased throughput.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

B. Shortcomings with conventional processes

Conventional poly etch with PR/BARC/OX mask suffers poly profile control and gate oxide loss. The conventional poly etch with PR/BARC/OX mask etch is preformed on two tools. First, the oxide hard mask is etched on a RIE etch tool, Next, the wafer is transferred to an $O_2$ plasma stripping tool. Third, the wafer is transferred back to the etcher where the polysilicon is etched using the hard masks as an etch mask.

This process has poor polysilicon profile control because RIE etches can't controlthe hardmask width for line widths less than about 0.25 μm.

Also the conventional 2 tool process causes the gate oxide loss because the RIE tool for oxide mask open will induce gate oxide micro-trench.

But if PR/BARC/Ox is opened by another tool and poly etch is conducted by photoresist free scheme, it will suffer the CD uniformity control, poly trench and low throughput issues. The RIE tool can't adequately control the Polysilicon etch that causes the bad CD uniformity. Also, the RIE has a low selectivity to Poly during the hard mask open that causes the poly trench. Low through put is caused because two tools (oxide plasma etcher and Poly RIE etcher) are used in the process.

Figure 1:
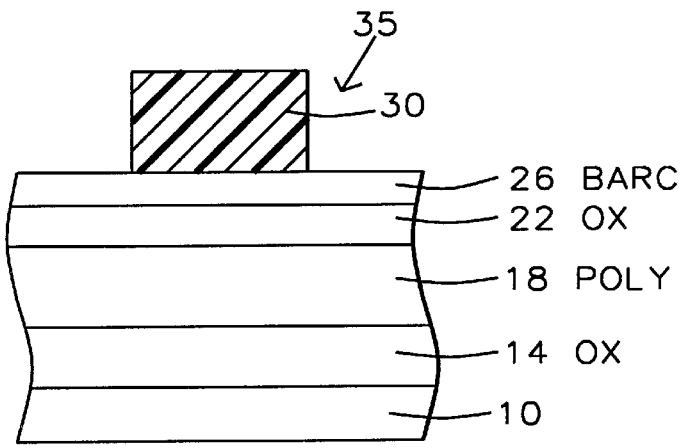
FIGS. 1 through 4 are cross sectional views for illustrating a method for forming a submicron polysilicon gate according to the present invention.

C. FIG. 1—formation of a gate oxide layer 14, a polysilicon layer 18, a hard mask layer 22 and a bottom anti-reflective coating (BARC) layer 26

FIG. 1 shows a structure 35 produced by the sequential forming a gate oxide layer 14, a polysilicon layer 18, a hard mask layer 22, and a bottom anti-reflective coating (BARC) layer 26 over a substrate 10. Below is a table is an overview of some embodiments in the drawings.

Substrate 10 is understood to possibly include a semiconductor wafer, active and passive devices formed within the wafer and layers formed on the wafer surface.

The gate oxide layer 14 is preferably composed of silicon oxide having a thickness in a range of between about 20 and 100 Å.

The polysilicon layer can is a poly-crystalline layer of silicon that is deposited on the gate oxide 14. The polysilicon layer can be uses as a silicon gate or can be used for interconnecting interconnections between devices. The polysilicon layer 18 preferably has a thickness in a range of between about 1000 and 3000 Å.

The polysilicon layer can also include a top $WSi_x$ or other refractory metal layer.

The hard mask layer 22 is preferably composed of silicon oxide, silicon nitride or Silicon oxynitride and is most preferably composed of silicon oxide.

The bottom anti-reflective coating (BARC) layer is preferably composed of polymer resin with photo compounds.

D. FIG. 1—forming a resist layer 30

Figure 2:
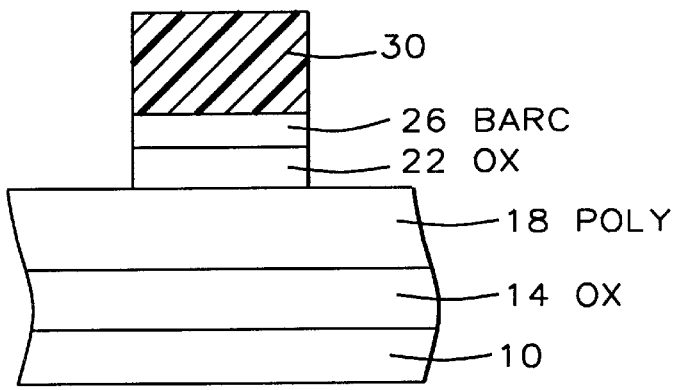
Figure 3:
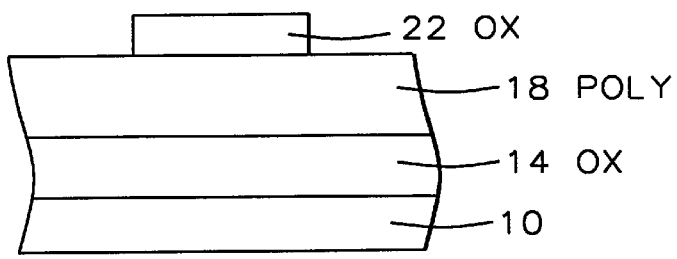
Figure 4:
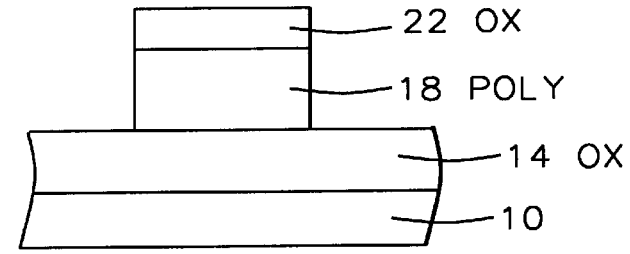

Still referring to FIG. 1, a resist layer 30 is formed over the bottom anti-reflective coating (BARC) layer 26. The resist layer 30 defines the polysilicon gate. As shown in FIG. 1, the photoresist layer 30 is exposed and developed to form a pattern that defines the polysilicon gate and other structures. The resist layer is preferably composed of a DUV positive photoresist, such as IBM APEX resist, IBM's KRS, Hoechst Ax's DX-46, OCG's ARCH resists, Shinetsu, Tok, AZ or JSR. The resist 30 can be composed of any photoresist material, such as negative photoresist. The resist preferably has a thickness in a range of between about 6000 and 15000 Å and a width in a range of between about 0.14 μm and 0.30 μm E. Summary of key steps of the insitu etch FIGS. 2, 3 and 4 show key steps in the invention. The invention has a total of 3 etch steps. Steps 1, 2 and are performed insitu a polysilicon HPD reactor. The first step is a BARC 26/oxide hard mask 22 etch in a high density plasma etcher. The second step is an insitu PR/BARC strip. The third step is an insitu polysilicon 18 etch using the oxide hard mask to from a polysilicon gate.

TABLE

| Element No. | generic name | preferred examples | Preferred Parameters (thickness, doping, etc . . . ) | Other alternate examples |
| --- | --- | --- | --- | --- |
| 14 | gate oxide layer | oxide | Thickness = 20 to 100 Å | nitrided oxide |
| 20 | polysilicon layer | Polysilicon or amorphous silicon | Th = 1000 to 3000 Å = doped or undoped | $WSi_x$ over polysilicon |
| 22 | a hard mask layer | Oxide | 200 to 3000 Å | nitride or oxynitride |
| 26 | bottom anti-reflective coating (BARC) layer | organic | Thickness = 500 to 2000 Å | |
| 30 | resist layer | DUV photoresist | 6000 to 13000 Å | i-line |

TABLE

Summary of the invention's 4 step insitu etch process.

| STEP | pressure (mtorr) | TCP Power (W) | Bias power (W) | Gas flows (SCCM) | Gas Flows (SCCM) | Gas flows (SCCM) |
|---|---|---|---|---|---|---|
| (1) BARC Open | 5 to 30 (tgt = 10) | 100–300 (tgt = 250) | 100–300 (Tgt = 250) | HBr 50 to 60 (tgt = 50) | $O_2$ 5–30 (tgt = 15) or $N_2$ 10–40/$O_2$ 5–30 | |
| (2) Oxide Open | 5 to 30 (tgt = 10) | 100 to 400 (tgt = 300) | 100–300 (Tgt = 250) | $C_2F_6$ 50 to 120 (tgt = 100) or $CF_4$ 50–120 tgt = 100 | | |
| (3) BARC striping | 5 to 80 (tgt = 20) | 100 to 400 (tgt = 300) | 0 to 200 (tgt = 0) | $O_2$ 100 to 500 (tgt = 200) | | |
| (4) Polysilicon Main etch (ME) | 5 to 30 (tgt = 10) | 100–300 (tgt = 150) | 100–300 (Tgt = 150) | $Cl_2$ 30 to 100 (tgt 50) | $HeO_2$ 0 to 20 (tgt = 10) | HBr 100 to 400 (tgt = 200) |
| Polysilicon overetch (OE) | 5 to 30 (tgt = 10) | 100–300 (tgt = 150) | 100–300 (Tgt = 150) | $Cl_2$ 30 to 100 (tgt 50) | $HeO_2$ 0 to 30 (tgt = 15) | HBr 50 to 300 (tgt = 150) |

F. Type of Reactor and etch

The invention's etch process can be performed on ECR, ICP, and TCP type etchers. It is important to note that RIE and MERIE etches can run the in-situ clean and can't adequately control the iso line and dense line CD. The book by C. Y. Chang, S. M. Sze, entiled in *ULSI Technology*, by The McGraw-Hill Company, INC. copyright 1997, on p. 350 lists examples of ECR, ICP, and TCP type etchers. A preferred polysilicon HDP etches is the TCP9400 by LAM. Polysilicon reactors differ from oxide reactors in the chemistry and reactor configuration. An oxide reactor and a polysilicon can't be used interchangeably.

To be a HDP reactor, a minimum ion plasma density of greater than 1E10 $cm^3$ must be achieved.

G. FIG. 2-Step 1—etching the BARC layer 26 a high density plasma (HDP) etcher

FIG. 2 shows the steps 1 and 2 of etching of the BARC layer 26 and the hard mask layer 22 a high density plasma (HDP) etcher. These novel steps provides unexpected good critical dimension (CD) uniformity. The resist layer 30 is used as an etch mask. The etch is performed using a high density plasma (Transformer coupled plasma) etch (not a RIE etch). The flows in the table can be converted into mole ratios for use in other etchers with different chamber sizes and wafer sizes.

Figure 5:
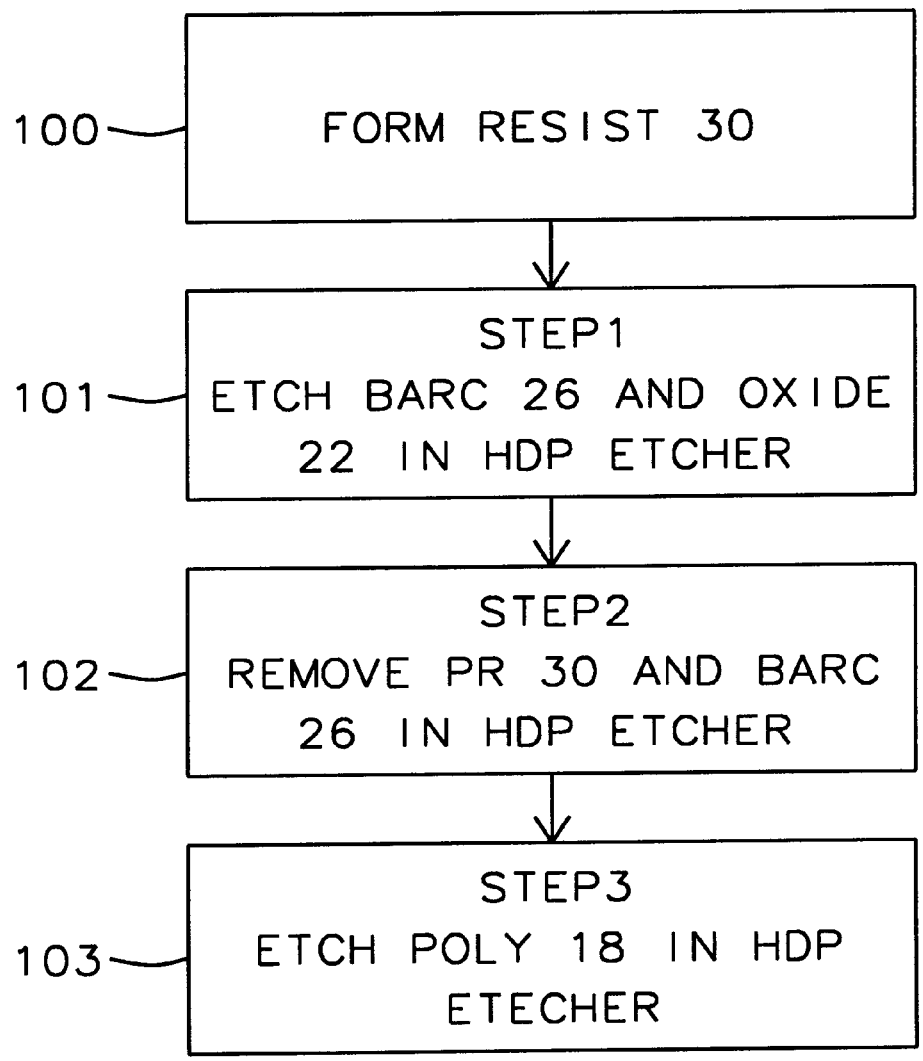
FIG. 5 is flow chart for illustrating the 4 step etch process according to the present invention. Steps 101, 102, 103 and 104 are the major steps of the invention.

H. FIG. 2 and FIG. 5 (step 2) etch the oxide hard mask layer 22 in a high density plasma (HDP) etcher Next, In step 2 (102) the oxide hard mask 22 is etch insitu. The process parameters are shown in the table above.

I. FIG. 3—removing resist layer 30 insitu in the high density

FIG. 3 & FIG. 5, shows step 3 (103) show the removal of the BARC layer 26 and the resist layer 30 insitu in the high density plasma (HDP) etcher.

The etch performed on a TCP reactor with a separate source and bias control. Separate source and bias controls are important. BARC is difficult to remove without Bias power. The invention requires use of a Biased $O_2$ plasma to strip the BARC (insitu) and sometime we add a small amount of $C_2F_6$ to enhance the BARC stripping.

J. FIG. 4—etching the polysilicon layer 18

FIG. 4—step 4 (FIG. 5 104) shows the forth etch step—etching the polysilicon layer 18 insitu in the polysilicon etcher using the hard mask layer 22 as an etch mask thereby forming the polysilicon gate 18. The key features of step 4 (polysilicon etch) that are most novel are: separate TCP and bias control that is unique because the invention's settings allow better CD control while avoiding polysilicon micro trenching.

The invention improves upon the known prior art. Below is a brief discussion of the invention's improvements over two patents.

U.S. Pat. No. 5,346,586 (Keller) shows polysilicon etch using a RIE etch with $CF_4$. Keller uses ozone plasma, not the invention's $O_2$ plamsa. Also, Keller's RIE etcher can not meet the CD requirements of 0.25 $\mu$m and beyond. The combination of Keller's RIE etch using $CF_4$ gives very poor critical dimension (CD) control if you have the invention's BARC layer 26 on top of the oxide hardmask 22. Moreover, Keller uses an $O_2$ plasma to remove the PR layer. However, if Keller's $O_2$ plasma was used to remove the invention's BARC 30, a residue would be formed (even if a $O_2$ plasma and a wet etch were used).

U.S. Pat. No. 5,094,712(Becker) One chamber in-situ etch process for oxide and conductive material—shows a method to anisotropically etch an oxide/silicide/poly sandwich structure on a silicon wafer substrate in-situ, that is, using a single parallel plate plasma reactor chamber and a single inert cathode. This method has an oxide etch step and a silicide/poly etch step, both of which are performed as plasma etch steps. The process allows a continuous etch to be applied without removing the wafer from the plasma reactor chamber. However, Becker shows a RIE poly etch that will not provide adequate poly CD uniformity. Keller does not strip the photoresist which then has the potential to damage the Gate oxide during the poly etch. In contrast, the invention uses a HDP-TCP polysilicon etch that has superior critical dimension (CD) uniformity.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a submicron polysilicon gate; comprising the steps of:
   forming sequentially a gate oxide layer, a polysilicon layer, a hard mask layer composed of silicon oxide, and a bottom anti-reflective coating (BARC) layer over a substrate;
   forming a resist layer over said bottom anti-reflective coating (BARC) layer; said resist layer defining said polysilicon gate;
   placing said substrate into a polysilicon high density plasma etcher and performing the following steps:
   a) in STEP 1, etching said bottom anti-reflective coating (BARC) layer by flowing bromine species gas and oxygen species gas, and applying a first TCP Power and a first Bias power;
   b) in STEP 2, etching said hard mask by flowing a flouorocarbon gas; and applying a second TCP Power and second Bias power;
   c) in STEP 3—stripping said bottom anti-reflective coating (BARC) layer by flowing oxygen and applying a third TCP Power and a third Bias power;
   d) in STEP 4—etching said polysilicon layer by flowing chlorine species, oxygen species; Helium species and bromine gas species and applying a fourth TCP Power and a fourth Bias power.

2. The method of claim 1 wherein said gate oxide layer composed of silicon oxide having a thickness in a range of between about 20 and 100 Å.

3. The method of claim 1 wherein said polysilicon layer having a thickness in a range of between about 1000 and 3000 Å.

4. The method of claim 1 wherein said hard mask layer composed of a material selected from the group consisting of silicon nitride, oxynitride; and silicon oxide and having a thickness in a range of between about 200 and 3000 Å.

5. The method of claim 1 wherein said hard mask layer composed of a material selected from the group consisting of silicon oxide and having a thickness in a range of between about 200 and 3000 Å.

6. The method of claim 1 wherein said bottom anti-reflective coating (BARC) layer composed of polymer resin with photo compounds.

7. The method of claim 1 wherein said resist layer having a thickness in a range of between about 6000 and 13000 Å and a width in a range of between about 0.14 µm and 0.25 µm.

8. The method of claim 1 wherein said step 1 further comprises the following conditions: a pressure between about 5 and 30 torr; a First TCP power between 100 and 300 W; a Bias power 100 and 300 W; a HBr flow between 50 and 60 sccm; a $O_2$ flow between about 5 and 30 sccm.

9. The method of claim 1 wherein said step 2 further comprises the following conditions: a pressure between about 5 and 30 torr; a second TCP power between about 100 and 400 W; a Second Bias power between 100 and 300 W; a $C_2F_6$ flow between about 50 and 120 sccm.

10. The method of claim 1 wherein Said step 3 further comprises the following conditions: a pressure between about 5 and 80 torr, a third TCP power between about 100 and 400 W; a third bias power between 0 and 200 W; a $O_2$ flow between about 100 and 500 sccm.

11. The method of claim 1 wherein said step 4 further comprises the following conditions: a pressure between about 5 and 30 mTorr; said Fourth TCP power between about 100 and 300 watts; a Bias power between about 100 and 300 W; a $Cl_2$ flow between about 30 and 100 sccm, a $HeO_2$ flow between about 0 and 20 sccm; a HBr flow between about 100 and 400 sccm.

12. A method of fabricating a submicron polysilicon gate; comprising the steps of:
   forming sequentially a gate oxide layer, a polysilicon layer, a hard mask layer composed of silicon oxide, and a bottom anti-reflective coating (BARC) layer over a substrate;
   forming a resist layer over said bottom anti-reflective coating (BARC) layer; said resist layer defining said polysilicon gate;
   placing said substrate into a polysilicon high density plasma etcher and performing insitu the following steps:
   a) STEP 1, etching said bottom anti-reflective coating (BARC) layer by flowing HBr and $O_2$ gasses, and applying a first TCP Power and a first Bias power; said step 1 further comprises the following conditions: a pressure between about 5 and 30 torr; said first TCP power between 100 and 300 W; said first Bias power 100 and 300 W;
   b) in STEP 2—etching said hard mask by flowing a flouorocarbon gas; and applying a second TCP Power and second Bias power; said step 2 further comprises the following conditions: a pressure between about 5 and 30 torr; a second TCP power between about 100 and 400 W; a Second Bias power between 100 and 300 W;
   c) in STEP 3—stripping said bottom anti-reflective coating (BARC) layer by flowing oxygen and applying a third TCP Power and a third Bias power, said step 3 further comprises the following conditions: a pressure between about 5 and 80 torr, a third TCP power between about 100 and 400 W; a third bias power between about 0 and 200 W; a $O_2$ flow between about 100 and 500 sccm; and
   d) in STEP 4—etching said polysilicon layer by flowing chlorine species, oxygen species; Helium species and bromine gas species and applying a fourth TCP Power and a fourth Bias power; said step 4 further comprises the following conditions: a pressure between about 5 and 30 mtorr; said Fourth TCP power between about 100 and 300 watts; said fourth Bias power between about 100 and 300 W.

13. The method of claim 12 wherein STEP 2 further comprises a $C_2F_6$ flow between about 50 and 120 sccm.

14. The method of claim 12 wherein STEP 3 further comprises a HBr flow between 50 and 60 sccm; a $O_2$ flow between about 5 and 30 sccm.

15. The method of claim 12 wherein STEP 3 further comprising a $Cl_2$ flow between about 30 and 100 sccm, a $HeO_2$ flow between about 0 and 20 sccm; a HBr flow between about 100 and 400 sccm.

16. A method of fabricating a submicron polysilicon gate; comprising the steps of:
   forming sequentially a gate oxide layer, a polysilicon layer, a hard mask layer composed of silicon oxide, and a bottom anti-reflective coating (BARC) layer over a substrate;
   forming a resist layer over said bottom anti-reflective coating (BARC) layer; said resist layer defining said polysilicon gate;
   placing said substrate into a polysilicon high density plasma etcher and performing insitu the following steps:

(1) in STEP 1, etching said bottom anti-reflective coating (BARC) layer at the following conditions: a pressure between about 5 and 30 torr; a first TCP power between 100 and 300 W; a Bias power 100 and 300 W; a HBr flow between 50 and 60 sccm; a $O_2$ flow between about 5 and 30 sccm;

(2) in STEP 2, etching said hard mask at the following conditions: a pressure between about 5 and 30 torr; a second TCP power between about 100 and 400 W; a Second Bias power between 100 and 300 W; a $C_2F_6$ flow between about 50 and 120 sccm;

(3) in STEP 3, stripping said bottom anti-reflective coating (BARC) layer at the following conditions: a pressure between about 5 and 80 torr, a third TCP power between about 100 and 400 W; a third bias power between about 0 and 200 W; a $O_2$ flow between about 100 and 500 sccm; and (4) in STEP 4, etching said polysilicon layer at the following conditions: a pressure between about 5 and 30 mTorr; a fourth TCP power between about 100 and 300 watts; a Bias power between about 100 and 300 W; a $Cl_2$ flow between about 30 and 100 sccm, a $HeO_2$ flow between about 0 and 20 sccm; a HBr flow between about 100 and 400 sccm.

* * * * *